(12) United States Patent
Matsumoto et al.

(10) Patent No.: US 8,601,834 B2
(45) Date of Patent: Dec. 10, 2013

(54) MANUFACTURING METHOD OF HERMETICALLY SEALED CONTAINER FOR HOLDING THEREIN ATMOSPHERE OF REDUCED PRESSURE

(75) Inventors: Mamo Matsumoto, Kawasaki (JP); Tomohiro Saito, Koza-gun (JP); Nobuhiro Ito, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 176 days.

(21) Appl. No.: 13/226,741

(22) Filed: Sep. 7, 2011

(65) Prior Publication Data

US 2012/0073727 A1   Mar. 29, 2012

(30) Foreign Application Priority Data

Sep. 27, 2010  (JP) ................. 2010-215249

(51) Int. Cl.
*C03C 27/10* (2006.01)

(52) U.S. Cl.
USPC . 65/43; 445/24; 445/25; 445/44; 219/121.64; 156/272.8

(58) Field of Classification Search
None
See application file for complete search history.

(56) References Cited

U.S. PATENT DOCUMENTS

| | | | |
|---|---|---|---|
| 5,426,631 A | 6/1995 | Miyazaki et al. | |
| 5,693,111 A | 12/1997 | Kadowaki et al. | |
| 5,722,031 A | 2/1998 | Fujii et al. | |
| 6,087,619 A | 7/2000 | Berkmanns et al. | |
| 6,109,994 A | 8/2000 | Cho et al. | |
| 6,113,450 A | 9/2000 | Narayanan et al. | |
| 6,517,399 B1 | 2/2003 | Ito et al. | |
| 6,817,917 B1 | 11/2004 | Kado et al. | |
| 6,926,571 B2 | 8/2005 | Ito et al. | |
| 7,039,303 B2 | 5/2006 | Kimura et al. | |
| 7,110,665 B2 | 9/2006 | Kamata et al. | |
| 7,362,038 B1 | 4/2008 | Jang et al. | |
| 7,383,875 B2 | 6/2008 | Yoshimura et al. | |

(Continued)

FOREIGN PATENT DOCUMENTS

| | | |
|---|---|---|
| JP | 08-022767 A | 1/1996 |
| JP | 08-250021 A | 9/1996 |

(Continued)

OTHER PUBLICATIONS

Mamo Matsumoto, U.S. Appl. No. 13/357,001, filed Jan. 24, 2012.

(Continued)

*Primary Examiner* — Matthew Daniels
*Assistant Examiner* — Lisa Herring
(74) *Attorney, Agent, or Firm* — Fitzpatrick, Cella, Harper & Scinto

(57) ABSTRACT

The present invention provides a hermetically sealed container offering a strength and airtightness which are reliable over time. A joining member having a viscosity with a negative temperature coefficient, having a softening temperature lower than those of a pair of glass substrates and a frame member, and extending into a frame shape is arranged between one of the pair of glass substrates and the frame member so that the joining member contacts both the one of the pair of glass substrates and the frame member. Then, the joining member is heated and thermally melted while being pressed so that the center G of an incoming heat flux distribution in the width direction of the joining member is positioned at an inner space E rather than the center of the joining member in the width direction thereof.

7 Claims, 10 Drawing Sheets

(56) References Cited

U.S. PATENT DOCUMENTS

| | | |
|---|---|---|
| 7,815,760 B2 | 10/2010 | Kimura et al. |
| 7,847,474 B2 | 12/2010 | Seon |
| 7,914,357 B2 | 3/2011 | Koyanagi et al. |
| 7,928,645 B2 | 4/2011 | Suzuki et al. |
| 7,972,461 B2 | 7/2011 | Hasegawa et al. |
| 8,038,498 B2 | 10/2011 | Miyauchi et al. |
| 2005/0151151 A1 | 7/2005 | Hawtof et al. |
| 2005/0199599 A1 | 9/2005 | Li et al. |
| 2006/0082298 A1 | 4/2006 | Becken et al. |
| 2006/0084348 A1 | 4/2006 | Becken et al. |
| 2006/0244363 A1 | 11/2006 | Seon et al. |
| 2006/0289870 A1 | 12/2006 | Hotta et al. |
| 2007/0051499 A1 | 3/2007 | Kaimura et al. |
| 2007/0195634 A1* | 8/2007 | Lee .................. 365/230.05 |
| 2007/0200476 A1 | 8/2007 | Kijima et al. |
| 2008/0106194 A1* | 5/2008 | Logunov et al. .......... 313/512 |
| 2008/0110561 A1 | 5/2008 | Lee et al. |
| 2009/0000731 A1 | 1/2009 | Hasegawa et al. |
| 2009/0066215 A1 | 3/2009 | Kweon |
| 2009/0120915 A1 | 5/2009 | Tagawa et al. |
| 2009/0199963 A1* | 8/2009 | Ohashi et al. ............. 156/273.9 |
| 2009/0221207 A1 | 9/2009 | Russell et al. |
| 2009/0229745 A1* | 9/2009 | Lee et al. ................ 156/272.8 |
| 2010/0045181 A1* | 2/2010 | Oh et al. ................ 313/512 |
| 2010/0186350 A1 | 7/2010 | Nakazawa et al. |
| 2010/0190408 A1 | 7/2010 | Kamiguchi et al. |
| 2010/0190409 A1 | 7/2010 | Kamiguchi et al. |
| 2011/0249376 A1 | 10/2011 | Wu |

FOREIGN PATENT DOCUMENTS

| | | |
|---|---|---|
| JP | 09-208270 A | 8/1997 |
| JP | 2002-137939 A | 5/2002 |
| JP | 2002-515392 A | 5/2002 |
| JP | 2007-234334 A | 9/2007 |
| JP | 2008-059781 A | 3/2008 |
| JP | 2009-070687 A | 4/2009 |
| JP | 2009-104841 A | 5/2009 |
| JP | 2009-196859 A | 9/2009 |

OTHER PUBLICATIONS

Mamo Matsumoto et al., U.S. Appl. No. 13/198,867, filed Aug. 5, 2011.
Ito et al., U.S. Appl. No. 12/178,230, filed Jul. 23, 2008.
Ito et al., U.S. Appl. No. 13/046,883, filed Mar. 14, 2011.
Ito et al., U.S. Appl. No. 13/070,527, filed Mar. 24, 2011.
Matsumoto et al., U.S. Appl. No. 13/079,104, filed Apr. 4, 2011.
Ishiwata et al., U.S. Appl. No. 13/151,342, filed Jun. 2, 2011.
Ito et al., U.S. Appl. No. 13/046,868, filed Mar. 14, 2011.

* cited by examiner

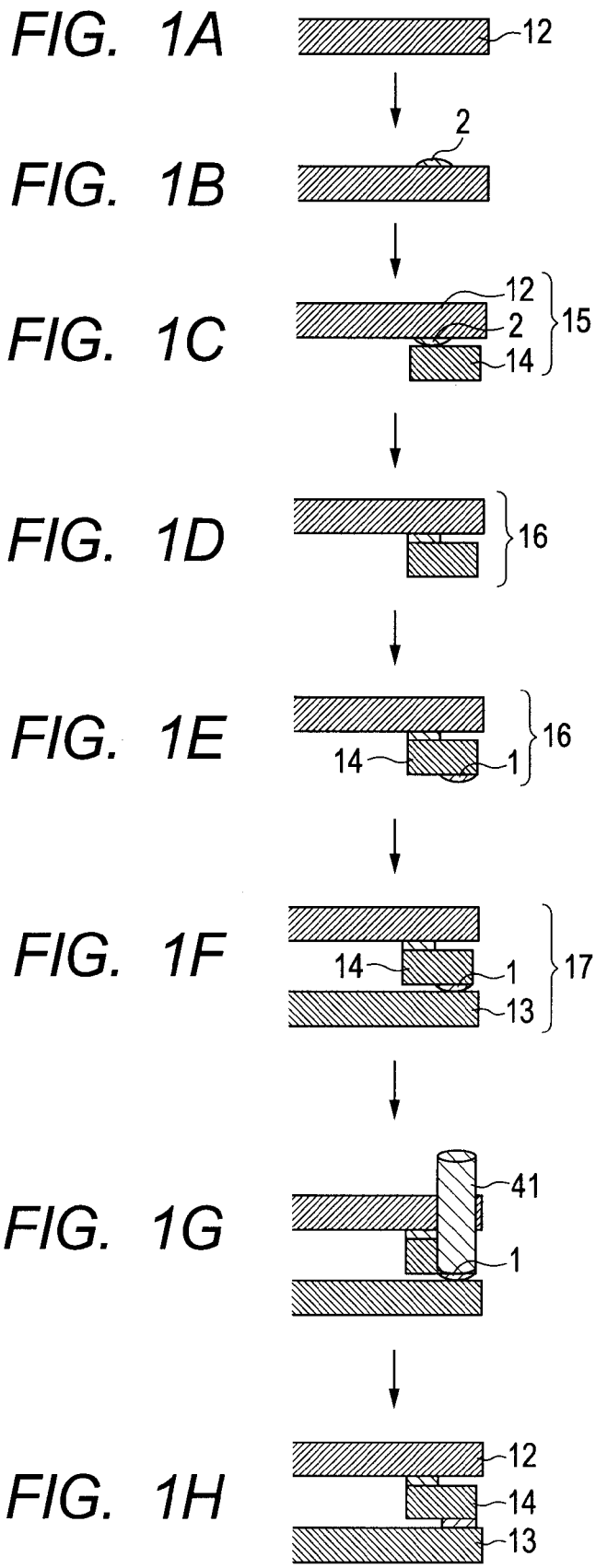

MANUFACTURING METHOD OF HERMETICALLY SEALED CONTAINER FOR HOLDING THEREIN ATMOSPHERE OF REDUCED PRESSURE

BACKGROUND OF THE INVENTION

1. Field of the Invention

The present invention relates to a manufacturing method of an evacuated hermetically sealed container, and in particular, to a manufacturing method of an internally vacuumized image display apparatus including an electron emitting device and a phosphor film.

2. Description of the Related Art

Image display apparatuses of a flat panel type such as organic LED displays (OLEDs), field emission displays (FEDs), and plasma display panels (PDPs) are well known. These image display apparatuses include an envelope manufactured by hermetically joining opposite glass substrates together and including an internal space partitioned off from an external space. Such a hermetically sealed container is manufactured by arranging a frame member, and as required, a distance defining member or a local adhesive, between the opposite glass substrates, arranging a joining member in a peripheral portion of the resultant structure in frame form, and heating and thermally joining the frame member and the glass substrate together. Known methods for heating the joining member include baking of the whole glass substrate using a heating furnace and selective heating of the periphery of the joining member by means of local heating. The local heating may be more advantageous than the overall heating in terms of heating and cooling time, the quantity of heat required for heating, productivity, prevention of thermal deformation of the container, prevention of thermal degradation of a functional device arranged inside the container, and the like. In particular, laser light is known as a local heating unit.

U.S. Patent Application No. 2008/0110561 discloses an example in which local heating with laser light is applied to a manufacturing method of an envelope for an OLED. An envelope is manufactured by heating and thermally melting a frit arranged between glass substrates, using laser light. A light shielding mask is formed in a part of each of the glass substrates through which laser light is transmitted. The glass substrates are joined together so that the quantity of irradiated laser light is distributed in a particular manner. The distributed quantity of irradiated laser light effectively serves to maintain the frit at an appropriate temperature. Thus, the frit and the glass substrate can be evenly joined together.

U.S. Patent Application No. 2006/0082298 discloses an example in which local heating with laser light is applied to a manufacturing method of an envelope for an OLED. An envelope is manufactured by heating and thermally melting a frit arranged between glass substrates, using laser light. The scanning speed, power, and heat quantity distribution of laser light are dynamically varied so as to uniformly heat the frit. Hence, the frit is kept at a substantially constant temperature, preventing the glass from being broken.

Japanese Patent Application Laid-Open No. 2009-196859 discloses a method of manufacturing a glass weld by heating and thermally melting, using laser light, a frit arranged between glass substrates to hermetically join the glass substrates together. Bubbled gas can be prevented from entering the inside of the weld by selectively melting only a part of the frit positioned outside the weld.

As described above, the joining method based on the overall heating and the joining method based on the local heating are conventionally known. For the joining method based on the local heating, a joining method is known which involves various irradiation methods improved in the respective manners instead of simple irradiation of the joining member with laser light. However, in the conventional art, when an attempt is made to obtain a heat quantity required to thermally melt and soften the joining member in order to achieve a sufficient joint strength, the joint strength and airtightness of the hermetically sealed container with a reduced pressure may decrease; the container includes the pair of glass substrates and the frame member. Specifically, when the inside of the hermetically sealed container is reduced in pressure, the following occurs because the frame member and the solidified joining member are only slightly compressively deformed: the glass substrates are deformed so as to be recessed inward at a central portion thereof so that the frame member serves as a fixed point. However, the following occurs because the frame member and the solidified joining member cannot follow this deformation: near the boundary between a part of the glass substrates which is in contact with the frame member and a part of the glass substrates which is not in contact with the frame member, the glass substrates are bound by the frame member and subjected to a high tensile stress. As a result, the glass substrate or the joining member may be destroyed, thus reducing the strength reliability and airtightness of the evacuated hermetically sealed container.

An object of the present invention is to provide a manufacturing method of a reliable evacuated hermetically sealed container which container offers both appropriate joint strength and airtightness.

SUMMARY OF THE INVENTION

According to the present invention, a manufacturing method of an evacuated hermetically sealed container comprising a pair of glass substrates opposing to each other, and a frame member arranged between the pair of substrates to define together with the pair of substrates the atmosphere of reduced pressure inside thereof, wherein the manufacturing method comprises steps of: arranging, between the frame member and one of the pair of substrates, a joining member having a viscosity with a negative temperature coefficient, having a softening temperature lower than those of the one of the pair of substrates and the frame member, and extending into a frame shape, so that the joining member contacts the one of the pair of substrates and contacts the frame member so as to form an assembly unit having an inner space being surrounded with the frame member and the pair of substrates; and heating and melting the joining member, while pressing the joining member, wherein a center of an incoming heat flux distribution in a direction of a width of the joining member is positioned more closely to the inner space of the assembly unit than a center of the width of the joining member.

According to the present invention, the one of the pair of glass substrates and the frame member are irradiated with the local heating light and joined together such that the center of the incoming heat flux distribution in the direction of the width of the joining member is positioned at the inner space of the assembly unit than the center of the width of the joining member. An area inside the joining member is subjected to a greater quantity of incoming heat flux than an outer space outside the joining member and is reduced in viscosity. Thus, the area inside the joining member is easily collapsed under pressure. As a result, compared to the film thickness of the joining member before the heating, the film thickness of the joining member after the heating is such that the joining member is relatively thin in the area inside the joining member and relatively thick in the area outside the joining member. The glass substrate is joined to the frame member in a state closer to a deformed state resulting from pressure reduction. The glass substrate is thus prevented from being subjected to a strong binding force by the frame member even if the hermetically sealed container is reduced in pressure. Hence, even with a possible difference in pressure between the inside and outside of the hermetically sealed container, possible tensile stress in the glass substrate acting at the junctions between the glass substrate and the frame member can be reduced.

As described above, the present invention can provide a manufacturing method of a reliable evacuated hermetically sealed container which container offers both appropriate joint strength and airtightness.

Further features of the present invention will become apparent from the following description of exemplary embodiments with reference to the attached drawings.

BRIEF DESCRIPTION OF THE DRAWINGS

FIGS. 1A, B, 1C, 1D, 1E, 1F, 1G and 1H are cross-sectional views of a junction illustrating an example of a manufacturing process flow of a hermetically sealed container.

DESCRIPTION OF THE EMBODIMENTS

Preferred embodiments of the present invention will now be described in detail in accordance with the accompanying drawings.

An exemplary embodiment of the present invention will be described below. A manufacturing method of a hermetically sealed container according to the present invention can be applied to manufacturing methods of an FED, an OLED, a PDP, and the like which include, in an internal space, a device that needs to be hermetically shielded from an external atmosphere. In particular, in image display apparatuses such as FEDs which include an internal space of reduced pressure, a hermetically sealed container may be subjected to an atmospheric pressure load owing to the negative pressure in the internal space. The atmospheric pressure load may then cause a crack in a hermetically sealed junction. Such a crack may damage the longtime reliability of joint strength and airtightness of the hermetically sealed container. The manufacturing method of a hermetically sealed container according to the present invention enables improvement of the longtime reliability of joint strength and airtightness of the hermetically sealed container. However, the manufacturing method of a hermetically sealed container according to the present invention is not limited to the manufacture of a hermetically sealed container with an internal space of reduced pressure. The present invention is widely applicable to the manufacture of a hermetically sealed container including a junction and for which opposite glass substrates need to be hermetically sealed at a peripheral portion thereof, or a junction unit including glass substrates joined together.

Figure 10:
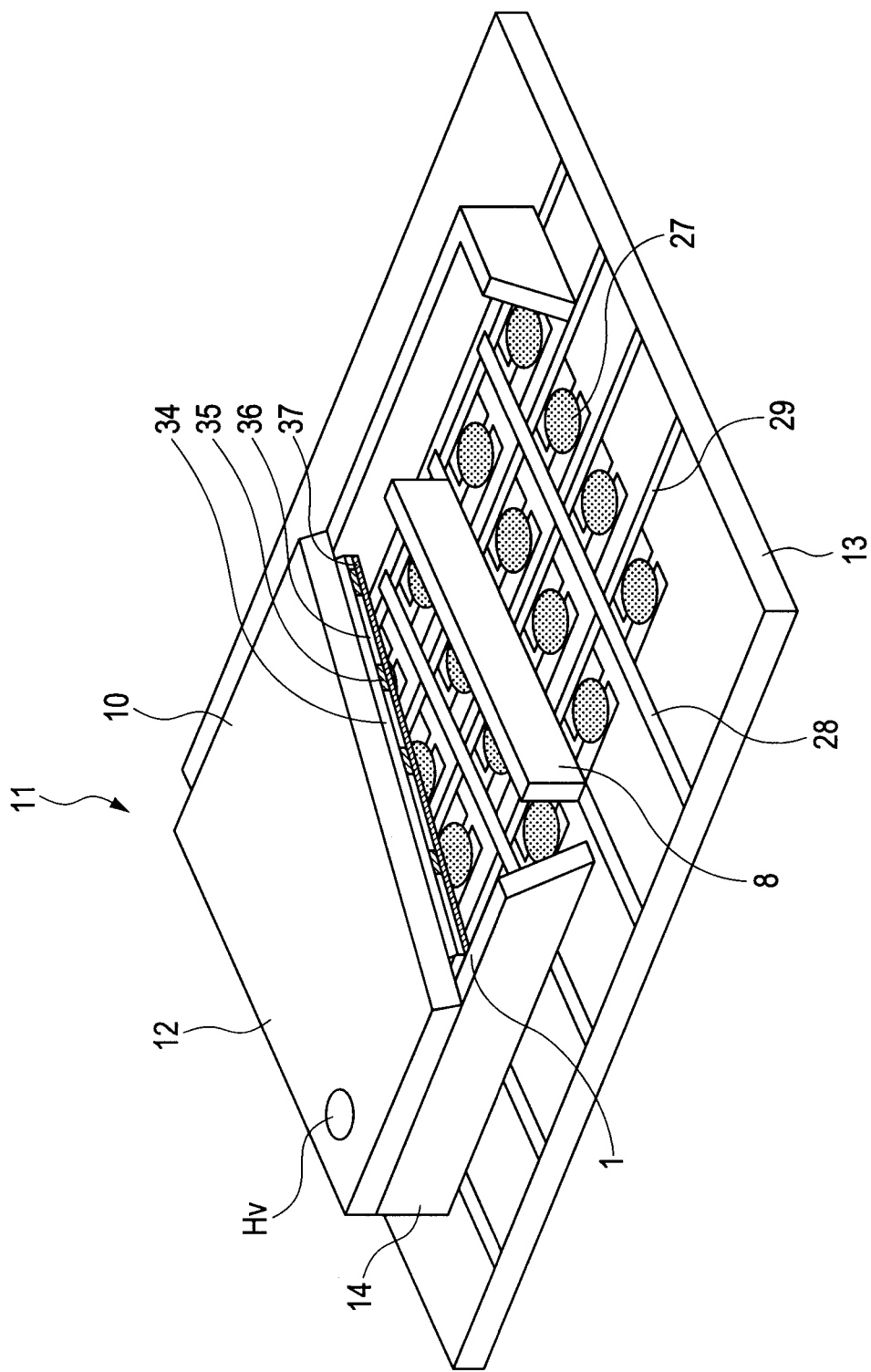
FIG. 10 is a partly exploded perspective view of an FED to which the manufacturing method of the evacuated hermetically sealed container according to the present invention can be applied.

FIG. 10 is a partly exploded perspective view illustrating an example of an image display apparatus for which the present invention is intended. A hermetically sealed container (envelope) 10 of an image display apparatus 11 includes a glass face plate 12, a rear plate 13, and a frame member 14. The face plate 12 and the rear plate 13 are a pair of glass substrates shaped like flat plates and located opposite each other. The frame member 14 is positioned between the face plate 12 and the rear plate 13 so as to form an internal space with a pressure lower than the atmospheric pressure together with the face plate 12 and the rear plate 13. Specifically, the face plate 12 and the frame member 14 are jointed together at the opposite surfaces thereof and the rear plate 13 and the frame member 14 are joined together at the opposite surfaces thereof to form the hermetically sealed container 10 with a closed internal space. A vacuum is maintained in the internal space in the hermetically sealed container 10. In the internal space, spacers 8 are provided at a predetermined pitch; each of the spacers 8 serves as a distance defining member configured to define the distance between the face plate 12 and the rear plate 13. The face plate 12 and the frame member 14, or the rear plate 13 and the frame member 14 may be pre-joined or integrated together.

The rear plate 13 includes a large number of electron emitting devices 27 provided thereon to emit electrons in accordance with image signals, and driving matrix wires (X direction wires 28 and Y direction wires 29) formed thereon to actuate the electron emitting devices 27 in accordance with image signals. The face plate 12, positioned opposite the rear plate 13, includes a phosphor film 34 provided thereon to emit light when irradiated with electrons emitted by the electron emitting devices 27 to display an image; the phosphor film 34 is formed of a phosphor. A black stripe 35 is further provided on the face plate 12. The phosphor film 34 and the black stripe 35 are alternately arranged on the face plate 12. A metal buck 36 made of an Al thin film is formed on the phosphor film 34. The metal buck 36 functions as an electrode that attracts electrons. The metal buck 36 is supplied with electrons from a high-voltage terminal Hv provided in the hermetically sealed container 10. A non evaporable getter 37 made of a Ti thin film is formed on the metal buck 36.

The face plate 12, the rear plate 13, and the frame member 14 may be transparent and translucent and can be formed of soda lime glass, high-strain-point glass, alkali-free glass, or the like. These members can offer appropriate wavelength transmissivity at usable wavelengths for local heating light described below and in an absorption wavelength band for a joining member.

Now, a form of a hermetically sealed container formed of glass substrates and to which the manufacturing method according to the present invention can be applied will be described.

The hermetically sealed container to which the manufacturing method according to the present invention is applicable is an evacuated hermetically sealed container in which the internal space in the hermetically sealed container has a relatively low air pressure compared to an external space with the hermetically sealed container arranged therein. Examples of the hermetically sealed container include a plasma display panel (PDP), an evacuated thermal insulating glazing glass, and an evacuated sound insulating glazing glass. In particular, the present invention can be applied as a manufacturing method of a vacuumized and hermetically sealed container such as an FED which includes a vacuum internal space. This will be described below in detail with reference to FIGS. 9A to 9D.

FIGS. 9A to 9D schematically illustrate cross sections of the hermetically sealed container observed before and after the internal space is reduced in pressure. A pair of substrates 12 and 13 forms the hermetically sealed container. A frame member 14 is sandwiched between the pair of substrates at a peripheral portion thereof and joined to the pair of substrates via joining members 1 and 2. The pair of substrates 12 and 13, the frame member 14, and the joining members 1 and 2 define an internal space with respect to an external space.

Figure 9A:
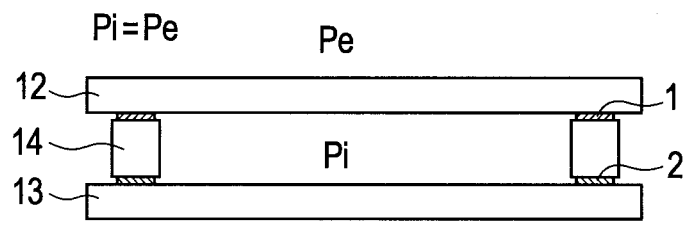
FIGS. 9A, 9B, 9C and 9D are schematic cross-sectional views illustrating a stress concentration area generated on an outer surface of the evacuated hermetically sealed container and near the junction of the container as well as the dependence of stress concentration on the sectional shape of the joining member.
Figure 9B:
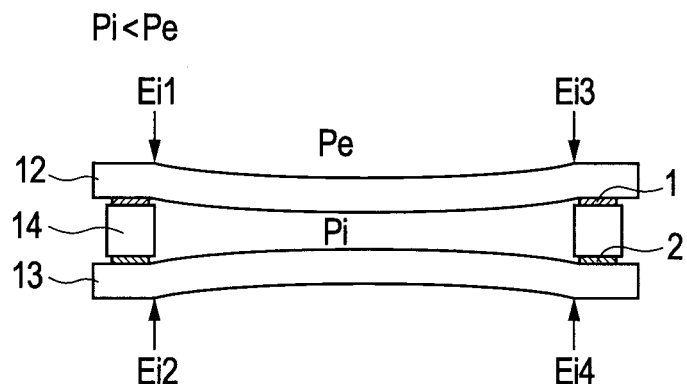

FIG. 9A schematically illustrates a form of the hermetically sealed container. In this form, the frame member and each of the substrates, between which the joining member is sandwiched, are arranged parallel to each other. Furthermore, the pressure Pe in the external space is the same as the pressure Pi in the internal space, with no difference in pressure between the internal space and the external space. At this time, the glass substrates are not subjected to deformation based on the difference in pressure between the inside and outside of the hermetically sealed container. FIG. 9B schematically illustrates a form of the evacuated hermetically sealed container. In this form, the internal space in the hermetically sealed container illustrated in FIG. 9A is evacuated so that the hermetically sealed container can hold therein an atmosphere of reduced pressure. In the evacuated hermetically sealed container, the pressure Pi in the internal space is negative with respect to the pressure Pe in the external space. Thus, the differential pressure between the internal space and the external space acts as a driving force to cause the container members to be elastically deformed toward the inside of the container. If the shape and distance of the inside of the container are defined in some parts of the container and not in the other parts, the container is more likely to be deformed toward the inside thereof in the parts with one of the shape and distance not defined than in the parts with one of the shape and distance defined. At the position of the joining member arranged at the peripheral portion of the hermetically sealed container, the frame member and the joining member define the distance between the pair of substrates. This prevents the pair of substrates from being deformed. On the other hand, an area of the pair of substrates located inside the area (hereinafter referred to as the junction area) fixed to the frame member with the joining member is elastically deformed toward the inside of the container by the differential pressure between the inside and outside of the container, which acts as a driving force.

As a result, a part of the substrate located near one of two edges of the junction area which lies closer to the internal space is deformed in the direction of the compression. On the external space side of the substrate at the position of the internal space-side edge, the substrate is thus deformed in a tensile direction. This means that tensile stress concentrates in areas shown at Ei1 to Ei4 in FIG. 9B. When glass is utilized for substrates, the occurrence frequency of cracks or the like may disadvantageously increase to reduce one of the airtightness and strength because the glass is a fragile material and is thus appropriately resistant to compressive stress but susceptible to tensile stress.

Figure 9C:
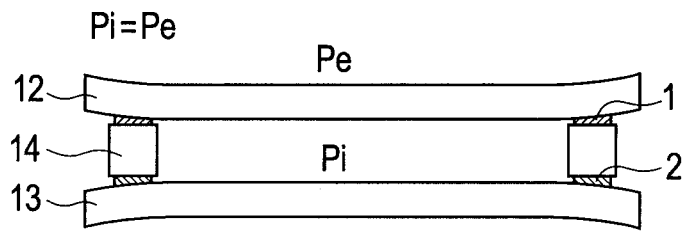
Figure 9D:
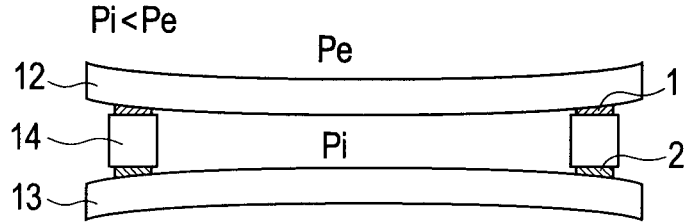

Now, a form of a hermetically sealed container to which the manufacturing method according to the present invention can be applied will be described in detail with reference to FIGS. 9C and 9D.

For easy understanding, a joining member 1 will be described as a typical example. A joining surface is formed which has a film thickness distribution in the width direction of the joining member 1 in which the internal space side of the container selectively has a smaller film thickness. Then, the pair of substrates form a sectional shape of the hermetically sealed container before pressure reduction (Pi=Pe) such that the substrates are closer to each other on the internal space side (FIG. 9C).

Moreover, even if the inside of the hermetically sealed container is evacuated so that the hermetically sealed container can hold therein an atmosphere of reduced pressure, the occurrence of tensile stress can be reduced in the areas corresponding to Ei1 to Ei4. This is because the substrates are elastically deformed toward the internal space but are unlikely to be locally deformed near the junction area. This is schematically illustrated in FIG. 9D.

As described above, the deformation of the substrates caused by the differential pressure is pre-estimated, and the joining member in the junction area is provided with a film thickness distribution. Then, even if the substrates are deformed as a result of the differential pressure between the internal space and the external space, the occurrence of tensile stress can be reduced in the areas corresponding to Ei1 to Ei4. An object of the manufacturing method according to the present invention is to utilize the above-described effect to provide a reliable hermetically sealed container configured to reduce possible tensile stress in the peripheral portion of the evacuated hermetically sealed container.

Now, a joining method of the glass substrates in the manufacturing method of the hermetically sealed container according to the present invention will be described with reference to the drawings. FIGS. 1A to 1H are schematic step diagrams of the manufacturing method of the hermetically sealed container.

(Step 1)

First, as illustrated in FIG. 1A, the face plate 12 is prepared. Then, as illustrated in FIG. 1B, the joining member 2 is formed on the face plate 12. The joining member 2 may have a negative viscosity temperature coefficient and may be softened at high temperature. Furthermore, the joining member 2 may have a lower softening point than any of the face plate 12, the rear plate 13, and the frame member 14. Examples of the joining member 2 include frit glass, an inorganic adhesive, and an organic adhesive. If the joining member 2 is applied to an FED or the like which needs to maintain a vacuum in the internal space, frit glass may be used, which allows decomposition of residual hydrocarbon to be suppressed.

(Step 2)

Then, as illustrated in FIG. 1C, the face plate 12 and the frame member 14 are arranged opposite each other to form a temporarily assembled structure 15 including the face plate 12 and the frame member 14. The joining member 2 is placed between the frame member 14 and the face plate 12 under pressure so as to contact both the frame member 14 and the face plate 12. The joining member 2 is arranged so as to be biased toward the inside of the hermetically sealed container compared to the center of the frame member 14 in the width direction thereof. Thus, when the joining member 1 described below is irradiated with local heating light 41 to join the rear plate 13 and the frame member 14 together (see FIG. 1G), the joining member 2 is prevented from interfering with the local heating light 41. Hence, an optical path is provided for the local heating light 41. The joining member 2 may be arranged so as to be biased toward the outside of the hermetically sealed container instead of the inside of the hermetically sealed container. Alternatively, when the joining member 2 is selected from a material which allows the local heating light 41 to pass through, an optical path can be provided for the local heating light 41 even if the joining member 1 is placed immediately below the joining member 2.

(Step 3: Joining Step of the Frame Member 14 and the Face Plate 12)

Then, as illustrated in FIG. 1D, the temporarily assembled structure 15 is thermally treated in a heating furnace. The joining member 2 is heated and thermally melted and then cooled to the room temperature. Thus, a junction unit 16 is obtained in which the face plate 12 and the frame member 14 are joined together by the joining member 2. Although the joining member 2 is formed on the face plate 12, the junction unit 16 can be obtained in similar steps even when the joining member 2 is formed on the frame member 14.

(Step 4)

Then, as illustrated in FIG. 1E, the joining member 1 is formed on the frame member 14 of the junction unit 16 obtained in step 3 in a manner similar to that of step 1. The joining member 1 has a viscosity with a negative temperature coefficient and is formed to extend like a frame on the frame member 14. Thereafter, as illustrated in FIG. 1F, the rear plate 13 with the electron emitting devices 27 and the like formed thereon is contacted with the frame member 14 via the joining member 1 to form a temporarily assembled structure 17. The temporarily assembled structure 17 is then pressed. The joining member 1 may be pressed so as to come into contact with the rear plate 13. As a result, the joining member 1 is placed between the rear plate 13 and the frame member 14 so as to contact both the rear plate 13 and the frame member 14. Examples of a specific pressurization method include a method of pressing one of the face plate 12 and the rear plate 13 using a spring material and a method of reducing the pressure of the inside of the temporarily assembled structure 17 to press the joining member 1 against the rear plate 13 utilizing the differential pressure between the inside and outside of the structure. Both of these methods may be used at the same time.

(Step 5: Joining Step of the Frame Member 14 and the Rear Plate 13)

Then, as illustrated in FIG. 1G, the joining member 1 is heated and thermally melted by being continuously pressed and irradiated with the local heating light 41 moved along the direction in which the joining member 1 extends. Thus, as illustrated in FIG. 1H, the rear plate 13 and frame member 14 arranged opposite each other are joined together.

Figure 2A:
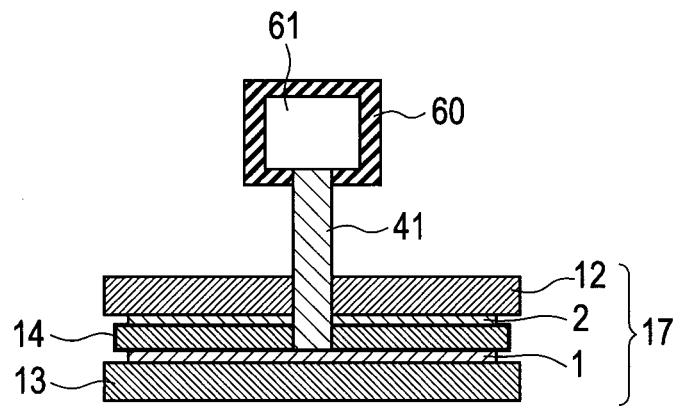
FIGS. 2A, 2B and 2C are conceptual drawings illustrating an example of an irradiation method of local heating light.
Figure 2B:
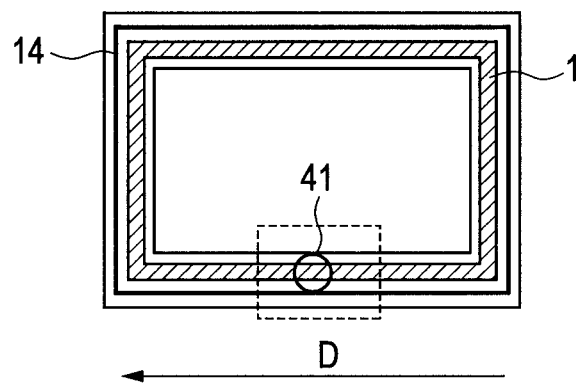
Figure 2C:
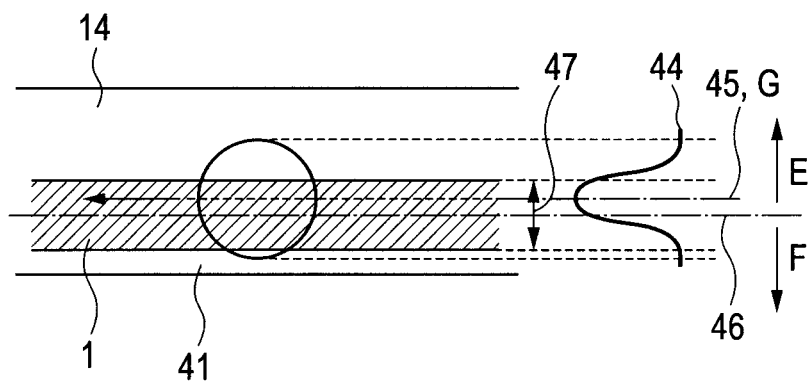

FIGS. 2A to 2C illustrate the present step in further detail. As illustrated in a side view in FIG. 2A, a laser head 61 fixed to a breadboard 60 and configured to emit the local heating light 41 is provided above the temporarily assembled structure 17. The local heating light 41 may locally heat the vicinity of the junction area. A semiconductor laser may be used as a light source for the laser head 61. A processing semiconductor laser with a wavelength in an infrared band may be used in terms of the performance of local heating of the joining member 1, the transmissivity of the glass substrates, and the like. The moving irradiation of the local heating light 41 may be carried out by moving one of an irradiation target and the laser head 61. That is, as illustrated in a plan view in FIG. 2B, the temporarily assembled structure 17 with the joining member 1 is scanned by the local heating light 41 while being moved in a direction D. However, the temporarily assembled structure 17, which is an irradiation target, may be fixed and scanned by the local heating light 41 emitted by the breadboard 60, moved in the direction D.

FIG. 2C is an enlarged view of a part of FIG. 2B shown by a dashed line and illustrates the distribution of the incident heat quantity on the joining member 1. The incident heat quantity means the quantity of heat (energy) of laser light emitted by the laser head 61. Furthermore, in the description below, the incoming heat quantity means the quantity of heat (energy) actually absorbed by the joining member 1. Here, the incident heat quantity and the incoming heat quantity have similar distributions. The incident heat quantity distribution of the local heating light 41 has a Gaussian beam profile. A peak position 45 of the Gaussian beam profile is biased toward the inside of the hermetically sealed container compared to a center line 46 of the joining member 1 in the width direction thereof. That is, the local heating light 41 has a heat quantity distribution symmetric in the width direction of the joining member 1 and is emitted to the joining member 1 so that the center of the incident heat quantity distribution is positioned in an area of the joining member 1 inside the center thereof in the width direction thereof (the area is hereinafter referred to as an inner space E).

Figure 3A:
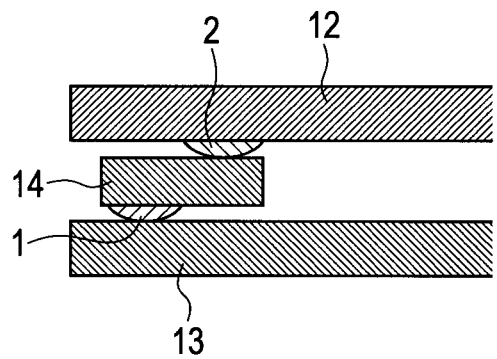
FIGS. 3A, 3B and 3C are cross-sectional views illustrating a form of a junction obtained by a manufacturing method of an evacuated hermetically sealed container according to the present invention.
Figure 3B:
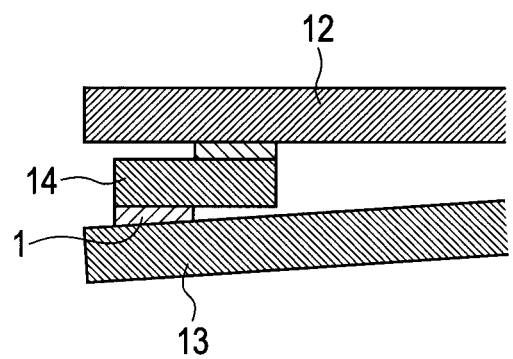

As a result, the joining member is irradiated with the local heating light 41 so that the center G of the incoming heat flux distribution of the local heating light 41 in the width direction of the joining member 1 is positioned in the inner space E of the joining member 1. In the present exemplary embodiment, the center G coincides with the peak position 45 of the Gaussian beam profile. A larger quantity of heat of the local heating light is fed into the inner space E of the joining member 1, which is thus heated to a higher temperature than an area of the joining member 1 located outside the center thereof in the width direction thereof (the area is hereinafter referred to as an outer space F). Thus, the inner space E of the joining member 1 has a reduced viscosity compared to the outer space F and is more easily collapsed upon pressurization than the outer space F. During formation of the joining member 1, the joining member 1 is formed substantially symmetrically with respect to the center in the width direction of the joining member 1 (FIG. 3A). However, as a result of heating and thermal melting under pressurization, the joining member 1 is melted so as to have a film thickness distribution in which the joining member 1 is thinner in the inner space E than in the outer space (FIG. 3B). In this state, the rear plate 13 and the frame member 14 are jointed together.

Figure 4A:
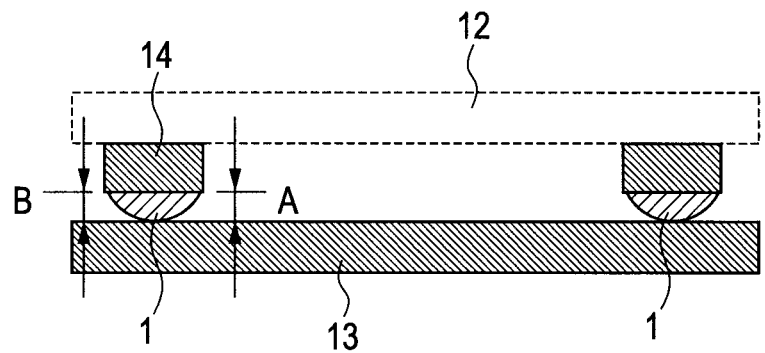
FIGS. 4A, 4B and 4C are conceptual drawings illustrating the effects of the present invention.
Figure 4B:
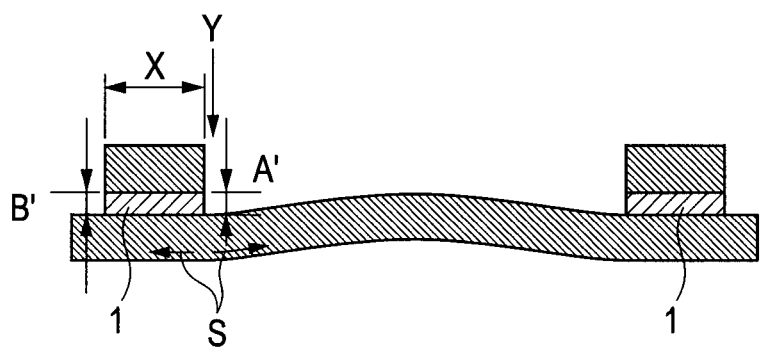
Figure 4C:
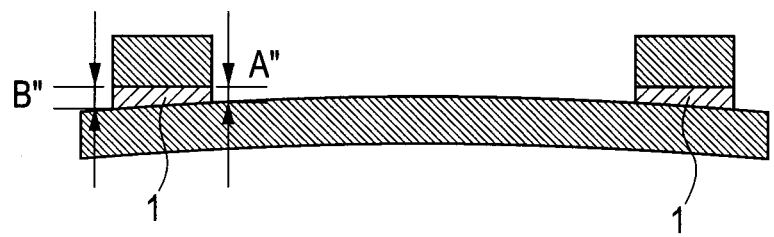

FIGS. 4A to 4C are schematic diagrams illustrating the effect of the present invention. FIG. 4A is a cross-sectional view illustrating that the joining member 1 has been formed. The gap between the rear plate 13 and the frame member 14 before irradiation with the local heating light is denoted by A at an inner peripheral position and by B at an outer peripheral position of the joining member 1. Here, for simplification, it is assumed that A=B. FIG. 4B is a cross-sectional view illustrating that the joining member has been irradiated with the local heating light according to the conventional art. Pressurization has reduced the gap A to A' and the gap B to B'. Since the incoming heat distribution is symmetric with respect to the center of the joining member 1 in the width direction thereof, the degree of the reduction is similar for the gaps A and B. That is, A'=B'. FIG. 4C is a cross-sectional view illustrating that the joining member has been irradiated with the local heating light according to the present exemplary embodiment. Since the center of the incoming heat flux distribution of the local heating light is positioned in the inner space E of the joining member 1, B">A". That is, compared to the film thickness of the joining member 1 before the local heating, the film thickness after the local heating is such that the joining member 1 is relatively thin on the inner side thereof and relatively thick on the outer side thereof.

When the rear plate 13 and the frame member 14 are joined together to form the hermetically sealed container 10 and the inside of the hermetically sealed container 10 is reduced in pressure relative to atmospheric pressure, the hermetically sealed container 10 is subjected to a load resulting from the atmospheric pressure. Specifically, as illustrated in FIG. 4B, the rear plate 13 is deformed so as to be recessed at a central portion thereof with the position of the frame member 14 serving as a fixed point. However, the frame member 14 and the hardened joining member 1 are prevented from being substantially compressed, thus precluding the rear plate 13 from being deformed along the above-described deformation mode on the inner peripheral side of the joining member 1. As a result, the rear plate 13 is not subjected to substantial bending deformation in an interval X where the rear plate 13 contacts the joining member 1, and rapidly starts to be deformed at a position Y slightly away from the area where the rear plate 13 contacts the joining member 1. At this position, great tensile stress S is generated. The tensile stress S is likely to cause a defect such as a crack or a junction failure near the junction between the rear plate 13 and the frame member 14.

In contrast, in the present exemplary embodiment, the film thickness of the joining member 1 is reduced at the inner peripheral portion thereof. Thus, as illustrated in FIG. 4C, the rear plate 13 is joined to the frame member 14 in a state closer to a deformed state resulting from pressure reduction. The rear plate 13 is thus prevented from being subjected to a strong binding force by the frame member 14 even if the hermetically sealed container is reduced in pressure. As a result, even with a possible difference in pressure between the inside and outside of the hermetically sealed container, possible tensile stress in the rear plate 13 acting at the junctions between the rear plate 13 and the frame member 14 can be reduced.

In the above description, A=B. However, in the present invention, A=B is not an essential condition; the ratio of the outer peripheral film thickness to the inner peripheral film thickness of the joining member 1 may be lower after heating of the joining member 1 (A'/B') than before the heating (A/B). That is, in general, the condition A/B>A'/B' may be satisfied.

In an actual hermetically sealed container, as described above, distance defining members such as spacers 8 may be provided between the rear plate 13 and the face plate 12 at positions inside the frame member 14. In this case, the deformation mode of the rear plate 13 is more complicated. However, a similar situation occurs at the junctions between the rear plate 13 and the frame member 14, and the present invention is thus effective regardless of whether or not the distance defining members are present.

Figure 3C:
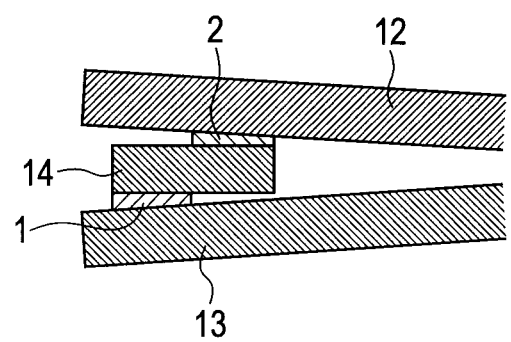

In the above-described step 3, the frame member 14 and the face plate 12 are joined together using the heating furnace. However, the frame member 14 and the face plate 12 can be joined together using the local heating light. In this case, as illustrated in FIG. 3C, the joining member 2 between the face plate 12 and the frame member 14 can also be irradiated with the local heating light so as to satisfy the above-described condition A/B>A'/B'. This enables a reduction in possible tensile stress in the face plate 12 acting at the junctions between the frame member 14 and the face plate 12. Thus, the longtime reliability of the hermetically sealed container can be improved with both appropriate joint strength and airtightness achieved.

Figure 5A:
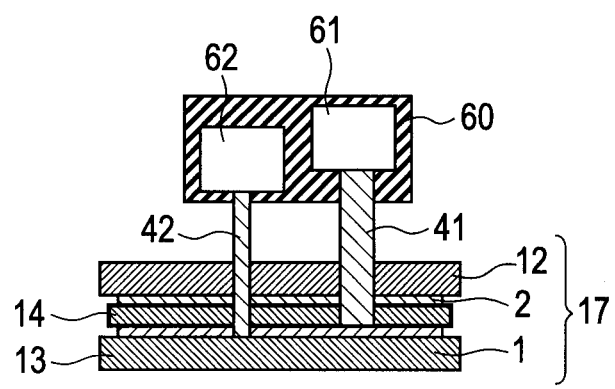
FIGS. 5A, 5B and 5C are conceptual drawings illustrating an example of an irradiation method of local heating light.
Figure 5B:
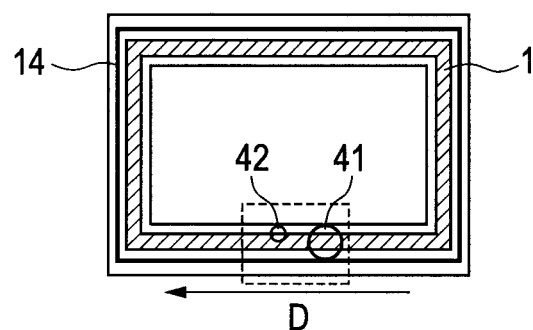
Figure 5C:
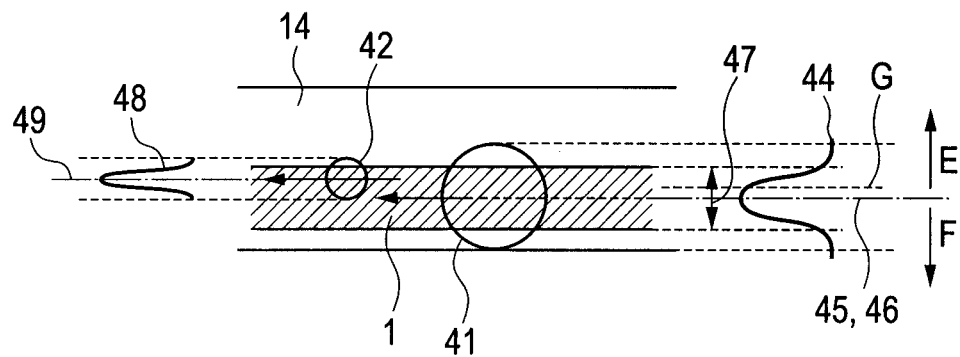

As illustrated in FIGS. 5A to 5C, the joining member may be irradiated with the local heating light a plurality of times. As illustrated in a side view in FIG. 5A, laser heads 61 and 62 fixed to the breadboard 60 are provided above the temporarily assembled structure 17; the laser head 61 is configured to emit the local heating light 41, and the laser head 62 is configured to emit local heating light 42. As illustrated in a plan view in FIG. 5B, the joining member is irradiated with the first local heating light 42 and the second local heating light 41 moved in the direction D with a predetermined distance maintained between the first local heating light 42 and the second local heating light 41. FIG. 5C is an enlarged view of a part of FIG. 5B which is shown by a dashed line. As illustrated in FIG. 5C, the first local heating light 42 has an effective beam diameter smaller than the width 47 of the joining member 1. A peak position 49 of the corresponding Gaussian beam profile is positioned in the inner space E of the joining member 1. The second local heating light 41 has an effective beam diameter larger than the width 47 of the joining member 1. A peak position 45 of the corresponding Gaussian beam profile is positioned on the center line 46 of the joining member 1 in the width direction thereof.

Also in this case, the center G of the heat flux distribution of the total incoming heat quantity, that is, the sum of incoming heat resulting from a plurality of irradiations, is positioned in the inner space E of the joining member 1. Thus, the inner space E of the joining member 1 can be collapsed more significantly than the outer space F thereof. Hence, a sectional shape equivalent to that in FIG. 3B can be obtained after joining. That is, as illustrated in FIG. 3B, the present exemplary embodiment allows manufacture of a hermetically sealed container with a film thickness distribution in which the joining member has a smaller film thickness in the inner space E than in the outer space F.

In the above-described example, first the inner space E of the joining member 1 is selectively reduced in viscosity using the first local heating light 42, and subsequently the joining member 1 is melted all over the width thereof using the second local heating light 41. However, this order may be reversed. That is, the joining member 1 may be irradiated first with the second local heating light 41 and then with the first local heating light 42. According to the present exemplary embodiment, the following is important: in a series of irradiations, the total quantity of heat fed into the joining member 1 is greater in the inner space E than in the outer space F. Thus, provided that this condition is met, the number of irradiations with the local heating light, the size of the effective beam diameter, and the inter-beam distance can be freely set.

Moreover, in FIGS. 5A to 5C, after being irradiated with the first local heating light 42, the joining member 1 may be melted by using a heating furnace (not shown in the drawings) to carry out overall heating instead of using the second local heating light 41. Also in this case, the center of the total quantity of heat resulting from the first local heating light 42 and heat fed by the heating furnace is positioned in the inner space E of the joining member 1. Hence, the joining member 1 is collapsed more significantly in the inner space E, resulting in the form illustrated in FIG. 3B.

To allow the center of the incoming heat flux distribution in the width direction of the joining member 1 to be positioned in the inner space E of the joining member 1, the center of the distribution of the quantity of heat fed may be positioned in the inner space E of the joining member 1 as described above. Additionally, the following method is possible.

Figure 6:
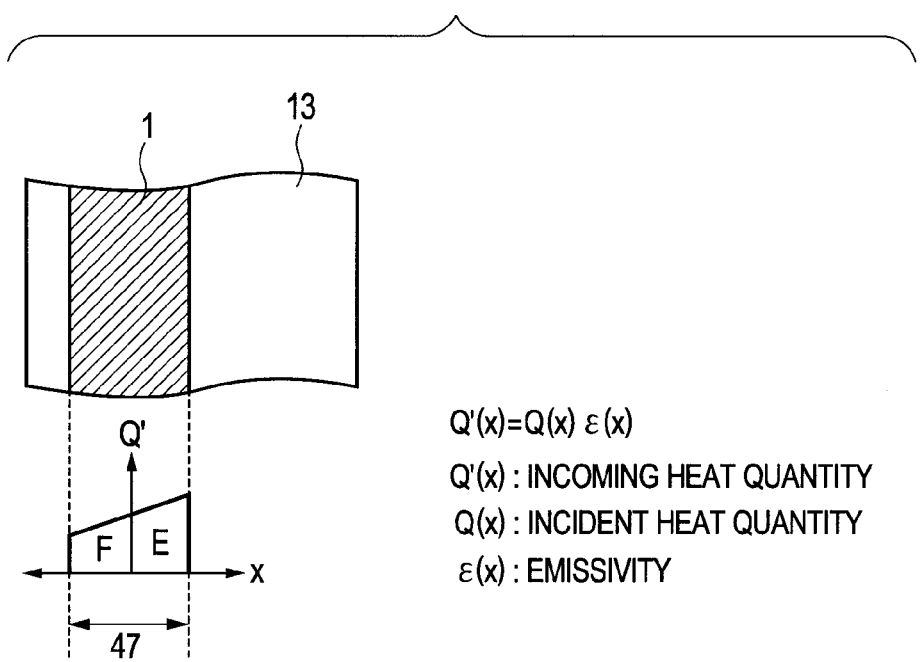
FIG. 6 is a drawing conceptually illustrating the relationship between an incoming heat quantity and an incident heat quantity and the emissivity of the joining member.

FIG. 6 is a diagram conceptually illustrating the relationship between an incoming heat quantity Q' and an incident heat quantity Q and the emissivity ϵ of the joining member 1. If the local heating light is used, the incident heat quantity Q means the quantity of heat (energy) of laser light emitted by the laser head. However, if both a local heating unit and an overall heating unit are used, the heating range of the local heating unit includes the quantity of heat supplied by the overall heating unit. The incoming heat quantity Q' can be considered to be the product of the incident heat quantity Q and the emissivity ϵ of the joining member 1 observed at any position (x) of the joining member 1 in the width direction thereof.

Figure 7A:
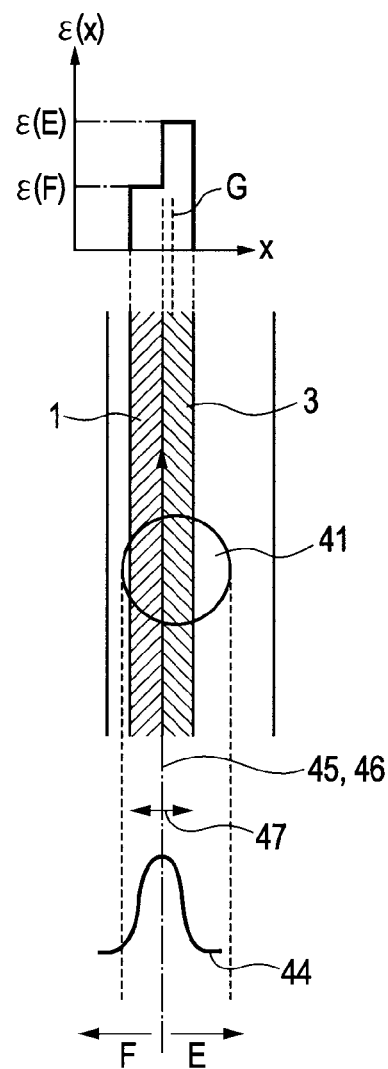
FIGS. 7A, 7B and 7C are conceptual drawings illustrating an example of an irradiation method of local heating light.
Figure 7B:
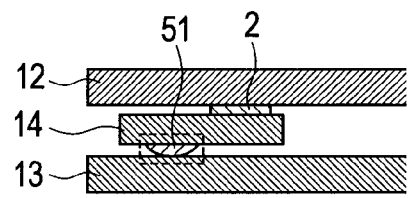
Figure 7C:
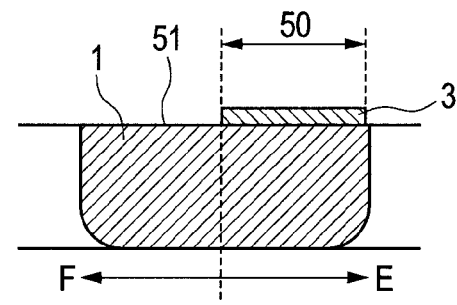

As illustrated in FIG. 7A, the center of a Gaussian beam profile 44 coincides with the center 45 of the joining member 1 in the width direction thereof. The incident heat quantity Q is the same for the inner space E and the outer space F of the joining member 1. Even in this case, the center G of the incoming heat (flux) quantity Q' fed into the joining member can be positioned in the inner space E by placing a material with a high emissivity in the inner space E of the joining member 1 in a surface on which the local heating light is incident. Specifically, in a surface 51 on which the local heating light is incident, the joining member may have an average emissivity ϵ(E) in the inner space E thereof which is higher than an average emissivity ϵ(F) in the outer space thereof. FIG. 7B is a cross-sectional view of the rear plate 13, the face plate 12, and the frame member 14. FIG. 7C is an enlarged view of a part of FIG. 7B which is shown by a dashed line. As illustrated in FIG. 7C, the incoming heat quantity in the inner space E of the joining member 1 can be increased by forming a joining member 3 with a higher emissivity ϵ than the joining member 1, in the surface 51 of the inner space F of the joining member 1. Thus, the incoming heat quantity Q' fed into the joining member 1 can be adjusted so as to be greater in the inner space E than in the outer space F by regulating the distribution of one of the incident heat quantity Q and the emissivity ϵ. Alternatively, a combination of the distribution of the incident heat quantity Q and the emissivity ϵ can be regulated. In the present exemplary embodiment, a material with a high emissivity is arranged in the inner space E of the joining member 1, eliminating the need to use the local heating light. Similar effects can be exerted by using the overall heating.

EXAMPLES

The present invention will be described below in further detail with specific examples.

Example 1

Step 1 (Step of Forming a Joining Member 2 on the Face Plate 12)

In the present example, frit glass was used as the joining members 1 and 2. As the frit glass, a paste was used which was obtained by using, as a base material, Bi-type lead-free frit glass having a coefficient of thermal expansion α of 79×10⁻⁷/° C., a transition point of 357° C., and a softening point of 420° C. (BAS115 manufactured by ASAHI GLASS CO., LTD.), and dispersedly mixing an organic substance into the base material as a binder. The paste was screen-printed on the face plate 12 along an area in which the face plate 12 was to be jointed to a frame member 14 so that the printed paste was 1.5 mm in width and 10 μm in thickness. The paste was then dried at 120° C. Then the paste was heated and burned at 460° C. in order to burn out the organic substance. Thus, the joining member 2 was formed (FIGS. 1A and 1B).

Step 2 (Step of Forming a Frame Member 14)

Subsequently, a frame member 14 was formed. Specifically, a high-strain-point glass substrate of 1.5 mm thickness (PD200 manufactured by ASAHI GLASS CO., LTD.) was prepared and cut so as to have an external size of 980 mm×580 mm×1.5 mm. Then, a central area of size of 970 mm×570 mm×1.5 mm was cut out by machining. Thus, a frame member 14 with a generally rectangular cross section and with a width of 5 mm and a thickness of 1.5 mm was obtained. Then, the surface of the frame member 14 was degreased by organic solvent washing, pure water rinsing, and UV-ozone washing.

Step 3 (Step of Joining the Frame Member 14 and the Face Plate 12 Together)

The face plate 12 with the joining member 2 formed thereon and the frame member 14 were temporarily assembled so that the joining member 2 contacted the frame member 14 (FIG. 1C). Moreover, the temporarily assembled structure was fed into the heating furnace with the face plate 12, the joining member 2, and the frame member 14 pressed by a pressing apparatus (not shown in the drawings) in order to supplement a pressing force. The temperature in the heating furnace was maintained at 460° C. for 30 minutes. Thereafter, the heating furnace was cooled to the room temperature. As a result, a junction unit 16 was obtained (FIG. 1D).

Step 4 (Step of Forming a Joining Member 1 on the Frame Member 14 and Contacting the Joining Member 1 with the Rear Plate 13)

As in the case of FIG. 1B, a joining member 1 was formed on the frame member 14, and a rear plate 13 was subsequently formed. Specifically, first, a glass substrate with an external size of 1,000 mm×600 mm×1.8 mm (PD200 manufactured by ASAHI GLASS CO., LTD.) was prepared, and the surface of the glass substrate was degreased by organic solvent washing, pure water rinsing, and UV-ozone washing. Then, surface electron-conductive electron emitting devices 27 and matrix wires 28 and 29 were formed in a central area of the resultant glass substrate which was 960 mm×550 mm in size. The electron emitting devices 27 formed were connected to the matrix wires 28 and 29 so as to enable 1,920×3×1,080 pixels to be individually driven. Then, a non evaporable getter material is deposited on the matrix wires 28 and 29 to a thickness of 2 μm by sputtering to form a non evaporable getter 37. As described above, the rear plate 13 was prepared. For vacuum evacuation, openings each having a diameter of 3 mm (not shown in the drawings) and penetrating the glass substrate were preformed in areas of the rear plate 13 in which the matrix wires 28 and 29 were not formed.

Then, the members were temporarily assembled together so that the frame member 14 with the joining member 1 formed thereon was aligned with the rear plate 13 and that the joining member 1 contacted the surface of the rear plate 13 with the electron emitting device 27 provided thereon. Thereafter, to uniformize the pressing force exerted on the joining member 1, a glass substrate (PD200 manufactured by ASAHI GLASS CO., LTD.) was placed over the frame member 14 using the pressing apparatus (not shown in the drawings) in a supplementary manner. The glass substrate used had the same size as that of the rear plate 13. Moreover, the rear plate 13, the joining member 1, and the frame member 14 were pressed by the pressing apparatus (not shown in the drawings) in order to supplement the pressing force. Thus, the rear plate 13 and the frame member 14 were contacted with each other via the joining member 1 (FIGS. 1E and 1F).

Step 5 (Step of Irradiating the Joining Member 1 with Local Heating Light to Join the Joining Member 1)

The temporarily assembled structure 17 produced in the step illustrated in FIG. 1F was irradiated with local heating light (laser light). In the present example, a processing semiconductor laser apparatus was prepared, and the laser head 61 was fixed to the breadboard 60. The optical axis of the local heating light 41 was set perpendicular to the face plate 12. The laser head 61 was arranged so that the distance between a laser exit hole and the face plate 12 was 10 cm (FIG. 2A).

Irradiation conditions for the local heating light 41 included a wavelength of 980 nm, a laser power of 220 W, and an effective beam diameter of 2.0 mm. An irradiation target including the joining member 1 was moved at a speed of 600 mm/sec. in the scanning direction D. The laser power was specified as an intensity value obtained by integrating the total luminous flux exiting the laser head. The effective beam diameter was specified as a range within which the intensity of the laser light was at least $e^{-2}$ times as great as the peak intensity.

As illustrated in FIG. 2C, the beam profile of the local heating light 41 had a Gaussian distribution. The center of the beam was kept 0.4 mm inward from the center of the joining member 1 in the hermetically sealed container. Scanning was carried out in the direction D (FIG. 1G and FIGS. 2B and 2C).

The above-described step was similarly carried out on the remaining three peripheral portions. Thus, the rear plate 13 and the frame member 14 were completely joined together (FIG. 1H).

Figure 8A:
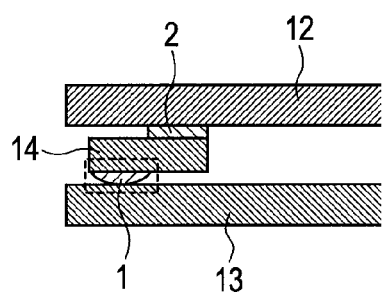
FIGS. 8A, 8B, 8C and 8D are schematic diagrams illustrating an observation method of the film thickness distribution of the joining member in examples.
Figure 8B:
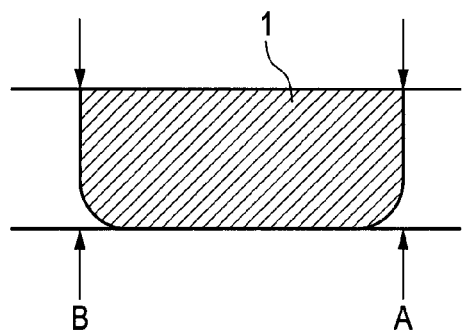
Figure 8C:
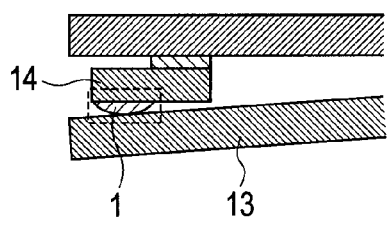
Figure 8D:
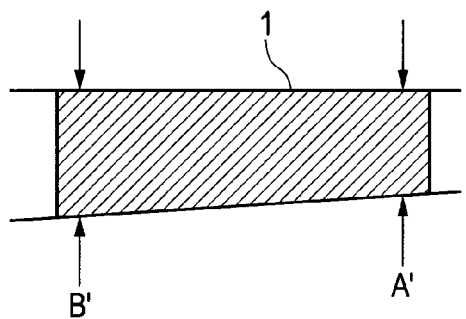

FIG. 8A is a cross-sectional view of the temporarily assembled structure obtained immediately before the irradiation of the joining member 1 with the local heating light. FIG. 8B is an enlarged view of a part of FIG. 8A shown by a dashed line. FIG. 8C is a cross-sectional view of the temporarily assembled structure obtained immediately after the irradiation of the joining member 1 with the local heating light. FIG. 8D is an enlarged view of a part of FIG. 8C shown by a dashed line. The gaps A (A') and B (B') between the frame member 14 and the rear plate 13 in the outer and inner peripheral portions, respectively, of the joining member were measured using a laser displacement meter. Before the irradiation with the local heating light, the gaps A and B were 11 μm and 10 μm, respectively. After the irradiation with the local heating light, the gaps A' and B' were 7 μm and 9 μm, respectively. This indicates that the joining member was collapsed more significantly in the inner space than in the outer space of the hermetically sealed container and was in the form illustrated in FIG. 3B.

An FED apparatus was produced as described above. When the apparatus was operated, electron emission performance and image display performance were stably maintained for a long time. The junction was determined to have a strength sufficient to allow the junction to be applied to FEDs as well as stable airtightness.

Example 2

In the present example, in the step illustrated in FIG. 1G, the joining member 1 was heated and thermally melted using first local heating light and second local heating light as illustrated in FIGS. 5A to 5C. Except for this, an FED apparatus was produced in the same manner as that in Example 1. Irradiation conditions for the first local heating light 42 included a wavelength of 980 nm, a laser power of 120 W, and an effective beam diameter of 1.0 mm. An irradiation target including the joining member 1 was moved at a speed of 600 mm/sec. in the scanning direction D. The beam profile of the first local heating light 42 had such a Gaussian distribution as illustrated in FIG. 5C. During the scanning, the center of the beam was kept 0.5 mm inward from the center of the joining member 1 in the hermetically sealed container. Irradiation conditions for the second local heating light 41 included a wavelength of 980 nm, a laser power of 220 W, and an effective beam diameter of 2.0 mm. Irradiation was carried out at a speed of 600 mm/sec. in the scanning direction D. The peak position 45 of the Gaussian beam profile was maintained on the center line 46 of the joining member 1 in the width direction thereof. The distance between the beam centers of the first local heating light and the second local heating light was set to 50 mm. With this distance maintained, the second local heating light 41 was allowed to follow the first local heating light 42. As is the case with Example 1, the laser displacement meter was used to measure the gaps between the frame member 14 and the rear plate 13 in the outer and inner peripheral portions, respectively, of the joining member. Before the irradiation with the local heating light, the gaps A and B were each 10 μm. After the irradiation with the local heating light, the gaps A' and B' were 5 μm and 9 μm, respectively. This indicates that the joining member was collapsed more significantly in the inner space than in the outer space of the hermetically sealed container and was in the form illustrated in FIG. 3B.

An FED apparatus was produced as described above. When the apparatus was operated, electron emission performance and image display performance were stably maintained for a long time. The junction was determined to have a strength sufficient to allow the junction to be applied to FEDs as well as stable airtightness.

Example 3

In the present example, in FIGS. 1F and 1G, the inside of the temporarily assembled structure 17 was reduced in pressure so that the joining member 1 was pressed by the atmospheric pressure. Except for this, an FED apparatus was produced in the same manner as that in Example 1. The gaps between the frame member 14 and the rear plate 13 in the outer and inner peripheral portions, respectively, of the joining member were measured in the same manner as that in Examples 1 and 2. Before irradiation with local heating light, the gaps A and B were 9 μm and 14 μm, respectively. After the irradiation with the local heating light, the gaps A' and B' were 5 μm and 12 μm, respectively. This indicates that the joining member was collapsed more significantly in the inner space than in the outer space of the hermetically sealed container and was in the form illustrated in FIG. 3B.

An FED apparatus was produced as described above. When the apparatus was operated, electron emission performance and image display performance were stably maintained for a long time. The junction was determined to have a strength sufficient to allow the junction to be applied to FEDs as well as stable airtightness.

Example 4

In the present example, in FIG. 1E, such a joining member 3 as illustrated in FIGS. 7A to 7C was formed on the frame member 14. Except for this, an FED apparatus was produced in the same manner as that in Example 1. As the joining member 3, frit glass was used which was formed of, as a base material, Bi-type lead-free frit glass (BAS115 manufactured by ASAHI GLASS CO., LTD.) and contained about 1.0 wt % of iron oxide. The joining member 3 was 0.7 mm in width and 1 to 2 μm in film thickness. The gaps between the frame member 14 and the rear plate 13 in the outer and inner peripheral portions, respectively, of the joining member were measured in the same manner as that in Examples 1 to 3. Before irradiation with local heating light, the gaps A and B were 10 μm and 11 μm, respectively. After the irradiation with the local heating light, the gaps A' and B' were 9 μm and 6 μm, respectively. This indicates that the joining member was collapsed more significantly in the inner space than in the outer space of the hermetically sealed container and was in the form illustrated in FIG. 3B.

An FED apparatus was produced as described above. When the apparatus was operated, electron emission performance and image display performance were stably maintained for a long time. The junction was determined to have a strength sufficient to allow the junction to be applied to FEDs as well as stable airtightness.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-215249, filed Sep. 27, 2010, which is hereby incorporated by reference herein in its entirety.

What is claimed is:

1. A manufacturing method of an evacuated hermetically sealed container comprising a pair of glass substrates opposite each other, and a frame member arranged between the pair of substrates to define together with the pair of substrates an atmosphere of reduced pressure inside thereof, wherein the manufacturing method comprises steps of:

arranging, between a frame member and one of a pair of substrates, a joining member (i) having a viscosity with a negative temperature coefficient, (ii) having a softening temperature lower than those of the one of the pair of substrates and the frame member, (iii) having a thickness ratio A/B, where A represents a thickness at an inner side of the joining member and B represents a thickness at an outer side of the joining member, and (iv) having a frame shape, so that the joining member contacts the one of the pair of substrates and contacts the frame member so as to form an assembly unit having an inner space being surrounded with the frame member and the pair of substrates;

heating and melting the joining member, while pressing the joining member, wherein a center of an incoming heat flux distribution in a direction of a width of the joining member is positioned more closely to the inner space than a center of the width of the joining member so as to reduce the thickness ratio A/B; and evacuating the inner space so as to be reduced in pressure relative to atmospheric pressure.

2. The manufacturing method according to claim 1, wherein the step of heating and melting the joining member includes scanning a local heating light in a direction along the frame shape of the joining member.

3. The manufacturing method according to claim 2, wherein the local heating light has a heat flux distribution symmetrical with regard to the width direction of the joining member, and a center of the heat flux distribution is positioned at an inner space side rather than the center of the width of the joining member.

4. The manufacturing method according to claim 2, wherein the joining member has an emissivity distribution depending on a distance from the inner space, such that an average emissivity of an inner region of the joining member has a higher average emissivity than an outer region of the joining member, wherein each of the inner and outer regions is positioned at an inner and outer space side against the center of the width of the joining member, respectively.

5. The manufacturing method according to claim 1, wherein the scanning by the local heating light is performed at a plurality of times, such that a center of a total incoming heat flux distribution by the plurality of times of scanning is positioned more closely to the inner space than the center of the width of the joining member.

6. The manufacturing method according to claim 1, wherein the joining member at the inner space side is formed from a glass frit containing iron oxide.

7. The manufacturing method according to claim 1, further comprising evacuating the inner space before the step of heating and melting the joining member so as to press the joining member and form an evacuated assembly unit having an evacuated inner space.

\* \* \* \* \*